United States Patent
Keil et al.

(10) Patent No.: US 9,644,271 B1
(45) Date of Patent: May 9, 2017

(54) SYSTEMS AND METHODS FOR USING ELECTRICAL ASYMMETRY EFFECT TO CONTROL PLASMA PROCESS SPACE IN SEMICONDUCTOR FABRICATION

(71) Applicant: Lam Research Corporation, Fremont, CA (US)

(72) Inventors: Douglas Keil, West Linn, OR (US); Ishtak Karim, Portland, OR (US); Yaswanth Rangineni, Beaverton, OR (US); Adrien LaVoie, Newberg, OR (US); Yukinori Sakiyama, West Linn, OR (US); Edward Augustyniak, Tualatin, OR (US); Karl Leeser, West Linn, OR (US); Chunhai Ji, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/154,715

(22) Filed: May 13, 2016

(51) Int. Cl.
*H01L 21/00* (2006.01)
*C23C 16/513* (2006.01)
*H01L 21/02* (2006.01)

(52) U.S. Cl.
CPC ...... *C23C 16/513* (2013.01); *H01L 21/02164* (2013.01); *H01L 21/02274* (2013.01)

(58) Field of Classification Search
None
See application file for complete search history.

(56) References Cited

U.S. PATENT DOCUMENTS

| | | | |
|---|---|---|---|
| 8,076,247 B2 * | 12/2011 | Collins | C23C 16/45574 216/71 |
| 2008/0180028 A1 * | 7/2008 | Collins | C23C 16/45574 315/111.21 |

* cited by examiner

*Primary Examiner* — Angel Roman
(74) *Attorney, Agent, or Firm* — Martine Penilla Group, LLP

(57) ABSTRACT

Systems and methods are disclosed for plasma enabled film deposition on a wafer in which a plasma is generated using radiofrequency signals of multiple frequencies and in which a phase angle relationship is controlled between the radiofrequency signals of multiple frequencies. In the system, a pedestal is provided to support the wafer. A plasma generation region is formed above the pedestal. An electrode is disposed in proximity to the plasma generation region to provide for transmission of radiofrequency signals into the plasma generation region. A radiofrequency power supply provides multiple radiofrequency signals of different frequencies to the electrode. A lowest of the different frequencies is a base frequency, and each of the different frequencies that is greater than the base frequency is an even harmonic of the base frequency. The radiofrequency power supply provides for variable control of the phase angle relationship between each of the multiple radiofrequency signals.

24 Claims, 10 Drawing Sheets

SYSTEMS AND METHODS FOR USING ELECTRICAL ASYMMETRY EFFECT TO CONTROL PLASMA PROCESS SPACE IN SEMICONDUCTOR FABRICATION

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a wafer exposed to the plasma. For example, various plasma-based processes can be used to etch material from a wafer surface, deposit material onto a wafer surface, or modify a material already present on a wafer surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, pressure within the plasma generation region, temperatures of the process gas and surrounding materials, frequency and magnitude of the RF power applied, and bias voltage applied to attract charged constituents of the plasma toward the wafer, among others.

However, in some plasma processes, the above-mentioned process parameters may not provide for adequate control of all plasma characteristics and behavior. In particular, in some plasma processes, an instability referred to as a "plasmoid" may occur within the plasma, where the plasmoid is characterized by a small area of higher density plasma surrounded by larger volumes of normal density plasma. The formation of plasmoids can lead to non-uniformity in the processing results on the wafer. Therefore, it is of interest to mitigate and/or control plasmoid formation within a plasma process without adversely impacting performance of the plasma process. It is within this context that the present invention arises.

SUMMARY

In an example embodiment, a method is disclosed for performing a plasma process to deposit a film on a wafer. The method includes positioning the wafer on a top surface of a pedestal in exposure to a plasma generation region. The method also includes supplying a process gas composition to the plasma generation region. The process gas composition includes oxygen and at least one bombardment gas. The method also includes generating radiofrequency signals of at least two different frequencies, where a lowest of the at least two different frequencies is a base frequency, and where each radiofrequency signal having a frequency greater than the base frequency is in an even harmonic relationship with the radiofrequency signal of the base frequency, and where each radiofrequency signal having a frequency greater than the base frequency is in a fixed phase relationship with the radiofrequency signal of the base frequency. The method also includes supplying the generated radiofrequency signals to an electrode for transmission into the plasma generation region so that the radiofrequency signals transform the process gas composition into a plasma within the plasma generation region, with the plasma causing deposition of the film on the wafer. The method also includes adjusting a phase angle relationship between radiofrequency signals of each of the at least two different frequencies to control a parameter of the film deposited on the wafer.

In an example embodiment, a system is disclosed for performing a plasma process to deposit a film on a wafer. The system includes a pedestal having a top surface configured to support the wafer. The system also includes a plasma generation region formed above the top surface of the pedestal. The system also includes a process gas supply configured to supply a process gas composition to the plasma generation region. The process gas composition includes oxygen and at least one bombardment gas. The system also includes an electrode disposed in proximity to the plasma generation region to provide for transmission of radiofrequency signals from the electrode into the plasma generation region. The system also includes a radiofrequency power supply configured to simultaneously supply multiple radiofrequency signals of different frequencies to the electrode, where a lowest of the different frequencies is a base frequency, and where each radiofrequency signal having a frequency greater than the base frequency is in an even harmonic relationship with the radiofrequency signal of the base frequency, and where each radiofrequency signal having a frequency greater than the base frequency is in a fixed phase relationship with the radiofrequency signal of the base frequency. The multiple radiofrequency signals have respective frequencies set to transform the process gas composition into the plasma within the plasma generation region to cause deposition of the film on the wafer. The radiofrequency power supply also includes a phase controller configured to provide for variable control of a phase angle relationship between each of the multiple radiofrequency signals, where adjustment of the phase angle relationship is used to control a parameter of the film deposited on the wafer.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Deposition of films on a semiconductor wafer can be accomplished using a plasma enhanced chemical vapor deposition (PECVD) process and/or a plasma enhanced atomic layer deposition (PEALD) process. The system used in the PECVD and PEALD processes may take many different forms. For example, the system can include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g., rotation, vibration, or other agitation). A wafer undergoing deposition may be transferred from one station to another within a reactor chamber during the process. Of course, the film deposition may occur entirely at a single station or any fraction of the film may be deposited at any number of stations. While in process, each wafer is held in place by a pedestal, wafer chuck, and/or other wafer holding apparatus. For certain operations, the apparatus may include a heater such as a heating plate to heat the wafer.

In an example embodiment, the term wafer as used herein refers to a semiconductor wafer. Also, in various embodiments, the wafer as referred to herein may vary in form, shape, and/or size. For example, in some embodiments, the wafer as referred to herein may correspond to a 200 mm (millimeters) semiconductor wafer, a 300 mm semiconductor wafer, or a 450 mm semiconductor wafer. Also, in some embodiments, the wafer as referred to herein may correspond to a non-circular substrate, such as a rectangular substrate for a flat panel display, or the like, among other shapes.

Figure 1A:
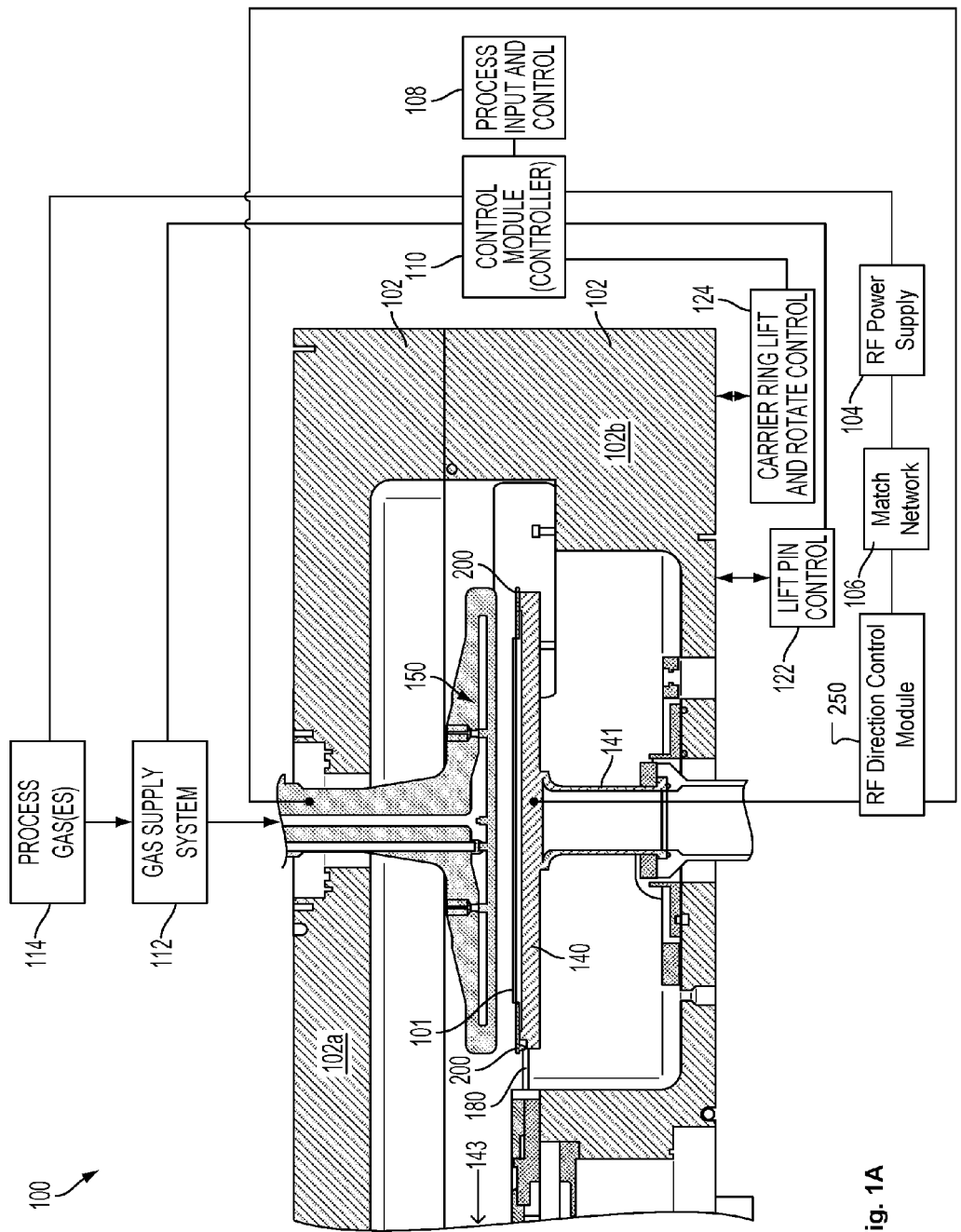
FIG. 1A illustrates a wafer processing system configured to perform a plasma enhanced film deposition process on a wafer, in accordance with some embodiments of the present invention.

FIG. 1A illustrates a wafer processing system 100 configured to perform a plasma enhanced film deposition process on a wafer 101, in accordance with some embodiments of the present invention. The system includes a chamber 102 having a lower chamber portion 102b and an upper chamber portion 102a. A center column 141 is configured to support a pedestal 140 formed of an electrically conductive material. The electrically conductive pedestal 140 is connected to receive RF signals from an RF power supply 104 by way of a match network 106, depending on a setting of an RF direction control module 250. Also, in the wafer processing system 100 of FIG. 1A, a showerhead electrode 150 is configured and connected to receive RF signals from the RF power supply 104 by way of the match network 106, depending on the setting of the RF direction control module 250. In some embodiments, the RF direction control module 250 is configured to direct RF signals transmitted from the RF power supply 104 by way of the match network 106 to either the showerhead electrode 150 or to the pedestal 140. Also, the RF direction control module 250 is configured to electrically connect whichever one of the showerhead electrode 150 and the pedestal 140 that is not currently receiving RF signals to a reference ground potential. In this manner, at a given time, the RF direction control module 250 operates to ensure that either the showerhead electrode 150 will receive RF signals from the RF power supply 104 while the pedestal 140 is electrically connected to the reference ground potential, or the pedestal 140 will receive RF signals from the RF power supply 104 while the showerhead electrode 150 is electrically connected to the reference ground potential.

The RF power supply 104 is controlled by a control module 110, e.g., a controller. The control module 110 is configured to operate the wafer processing system 100 by executing process input and control instructions/programs 108. The process input and control instructions/programs 108 may include process recipes, having directions for parameters such as power levels, timing parameters, process gases, mechanical movement of the wafer 101, etc., such as to deposit or form films over the wafer 101.

In some embodiments, the center column 141 can include lift pins, which are controlled by lift pin control 122. The lift pins are used to raise the wafer 101 from the pedestal 140 to allow an end-effector to pick up the wafer 101, and to lower the wafer 101 after being placed by the end-effector. The wafer processing system 100 further includes a gas supply system 112 that is connected to process gas supplies 114, e.g., gas chemistry supplies from a facility. Depending on the processing being performed, the control module 110 controls the delivery of process gases 114 via the gas supply system 112. The chosen process gases are then flowed into the showerhead electrode 150 and distributed into a plasma processing region between the showerhead electrode 150 and the wafer 101 disposed upon the pedestal 140.

Further, the process gases may be premixed or not. Appropriate valving and mass flow control mechanisms may be employed within the gas supply system 112 to ensure that the correct process gases are delivered during the deposition and plasma treatment phases of the process. Process gases exit the plasma processing region and flow through an exhaust outlet 143. A vacuum pump (such as a one or two stage mechanical dry pump, among other types) draws process gases out of the processing volume and maintains a suitably low pressure within the processing volume by a closed loop feedback controlled flow restriction device, such as a throttle valve or a pendulum valve.

Also shown is a carrier ring 200 that encircles an outer region of the pedestal 140. The carrier ring 200 is configured to support the wafer 101 during transport of the wafer 101 to or from the pedestal 140. The carrier ring 200 is configured to sit over a carrier ring support region that is a step down from a wafer support region in the center of the pedestal 140. The carrier ring 200 has an annular shaped disc structure and includes an outer edge side of its disc structure, e.g., outer radius, and a wafer edge side of its disc structure, e.g., inner radius, that is closest to where the wafer 101 sits. The wafer edge side of the carrier ring 200 includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system. Carrier ring lift and/or rotate control signals 124 are generated by the control module 110 to control operation of the spider forks 180 to lift and/or rotate the carrier ring 200.

Figure 1B:
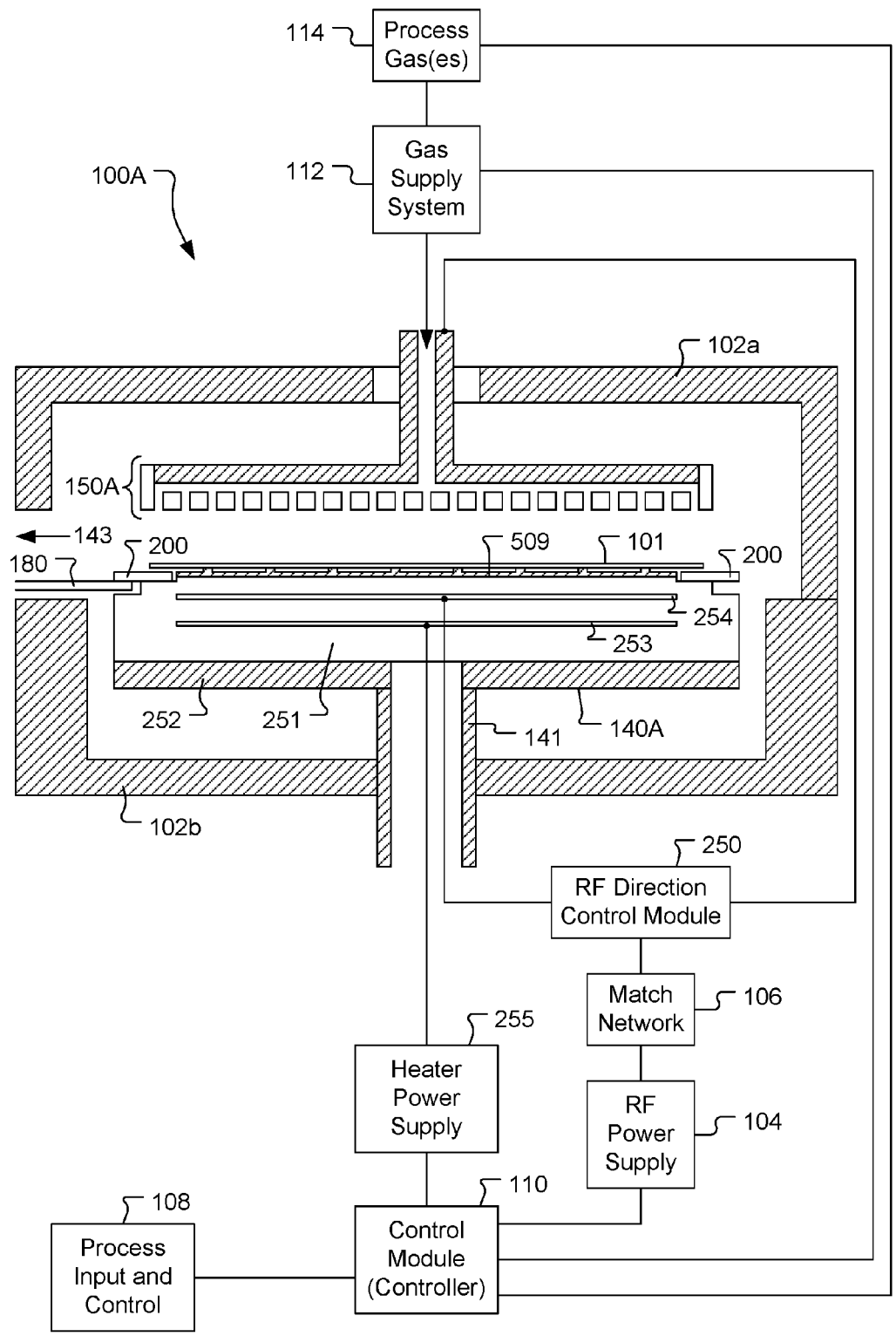
FIG. 1B illustrates a wafer processing system that is configured to perform an atomic layer deposition (ALD) process on the wafer (e.g. an ALD oxide process), in accordance with some embodiments of the present invention.

FIG. 1B illustrates a wafer processing system 100A that is configured to perform an atomic layer deposition (ALD) process on the wafer 101 (e.g. an ALD oxide process), in accordance with some embodiments of the present invention. Similar componentry as described with regard to FIG. 1A is shown in FIG. 1B. Specifically, the wafer processing system 100A also includes the upper chamber portion 102a, the lower chamber portion 102b, the control module 110, the RF power supply 104, the match network 106, the carrier ring 200, and the spider forks 180. In the wafer processing system 100A, a pedestal 140A is configured to include a dielectric body 251. In some embodiments, the pedestal 140A includes an electrically conductive layer 509 disposed on a top surface of the dielectric body 251, with the wafer 101 disposed on the electrically conductive layer 509. However, in some embodiments, the electrically conductive layer 509 is not present, and the wafer 101 is disposed directly on the top surface of the dielectric body 251. In some embodiments, the dielectric body 251 is affixed directly to the column 141. And, in some embodiments, the dielectric body 251 is supported by a conductive structure 252 that is affixed to the column 141.

In some embodiments, a heating component 253, such as a resistance heating element, is disposed with the dielectric body 251 of the pedestal 140A. The heating component 253 is connected to a heater power supply 255, which is in turn connected to the control module 110. With the heating component 253 present, in some embodiments, the heater power supply 255 can be operated in accordance with a prescribed recipe as provided by the process input and control instructions/programs 108 and as executed by the control module 110. It should also be understood that temperature measurement devices can be installed on/within the pedestal 140A and/or at other locations around the pedestal 140A to provide temperature measurement data to the control module 110, thereby enabling operation of a closed-loop temperature feedback control circuit between the control module 110 and the heater power supply 255.

The dielectric body 251 of the pedestal 140A includes an RF electrode 254 configured and connected to receive RF signals from the RF power supply 104 by way of the match network 106, depending on the setting of an RF direction control module 250. Also, in the wafer processing system 100A of FIG. 1B, a showerhead electrode 150A is configured and connected to receive RF signals from the RF power supply 104 by way of the match network 106, depending on the setting of the RF direction control module 250. In some embodiments, the RF direction control module 250 is configured to direct RF signals transmitted from the RF power supply 104 by way of the match network 106 to either the showerhead electrode 150A or to the RF electrode 254. Also, the RF direction control module 250 is configured to electrically connect whichever one of the showerhead electrode 150A and the RF electrode 254 that is not currently receiving RF signals to a reference ground potential. In this manner, at a given time, the RF direction control module 250 operates to ensure that either the showerhead electrode 150A will receive RF signals from the RF power supply 104 while the RF electrode 154 is electrically connected to the reference ground potential, or the RF electrode 154 will receive RF signals from the RF power supply 104 while the showerhead electrode 150A is electrically connected to the reference ground potential.

Figure 2:
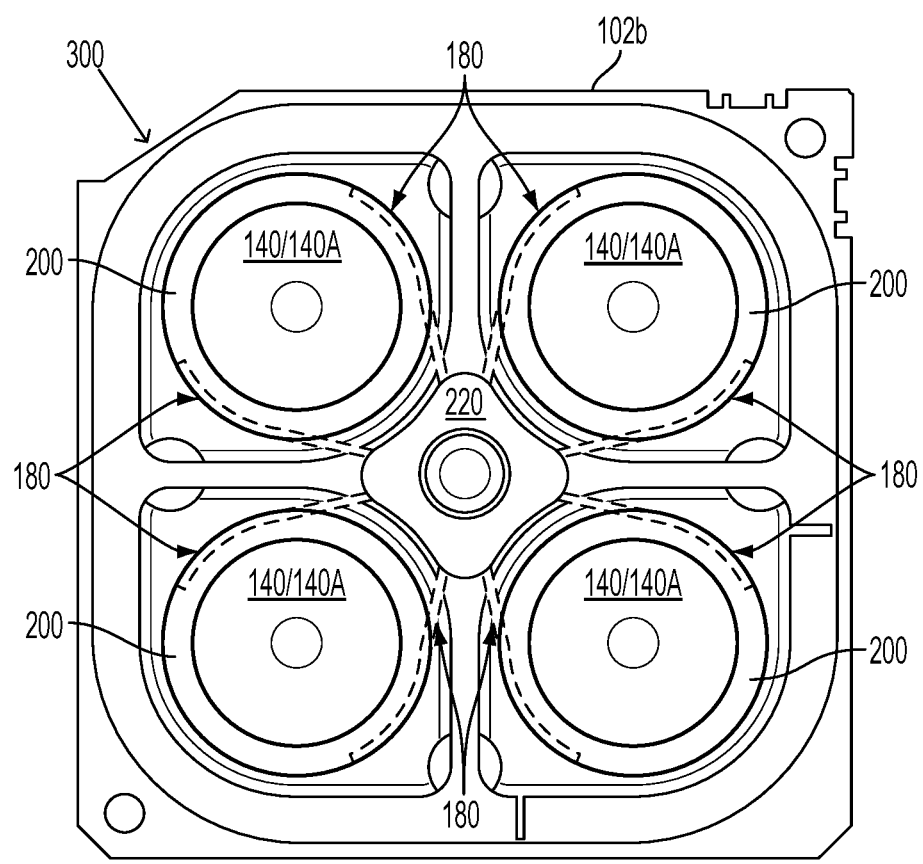
FIG. 2 shows a top view of a multi-station processing tool that includes four processing stations, in accordance with some embodiments of the present invention.

FIG. 2 shows a top view of a multi-station processing tool 300 that includes four processing stations, in accordance with some embodiments of the present invention. This top view is of the lower chamber portion 102b (e.g., with the top chamber portion 102a removed for illustration). The four processing stations are accessed by spider forks 180. Each spider fork 180, or fork, includes a first and second arm, each of which is positioned around a portion of each side of the pedestal 140/140A. The spider forks 180, using an engagement and rotation mechanism 220 are configured to raise up and lift the carrier rings 200 (i.e., from a lower surface of the carrier rings 200) from the processing stations in a simultaneous manner, and then rotate a distance of at least one or more stations before lowering the carrier rings 200 (where at least one of the carrier rings supports a wafer 101) so that further plasma processing, treatment and/or film deposition can take place on respective wafers 101.

Figure 3:
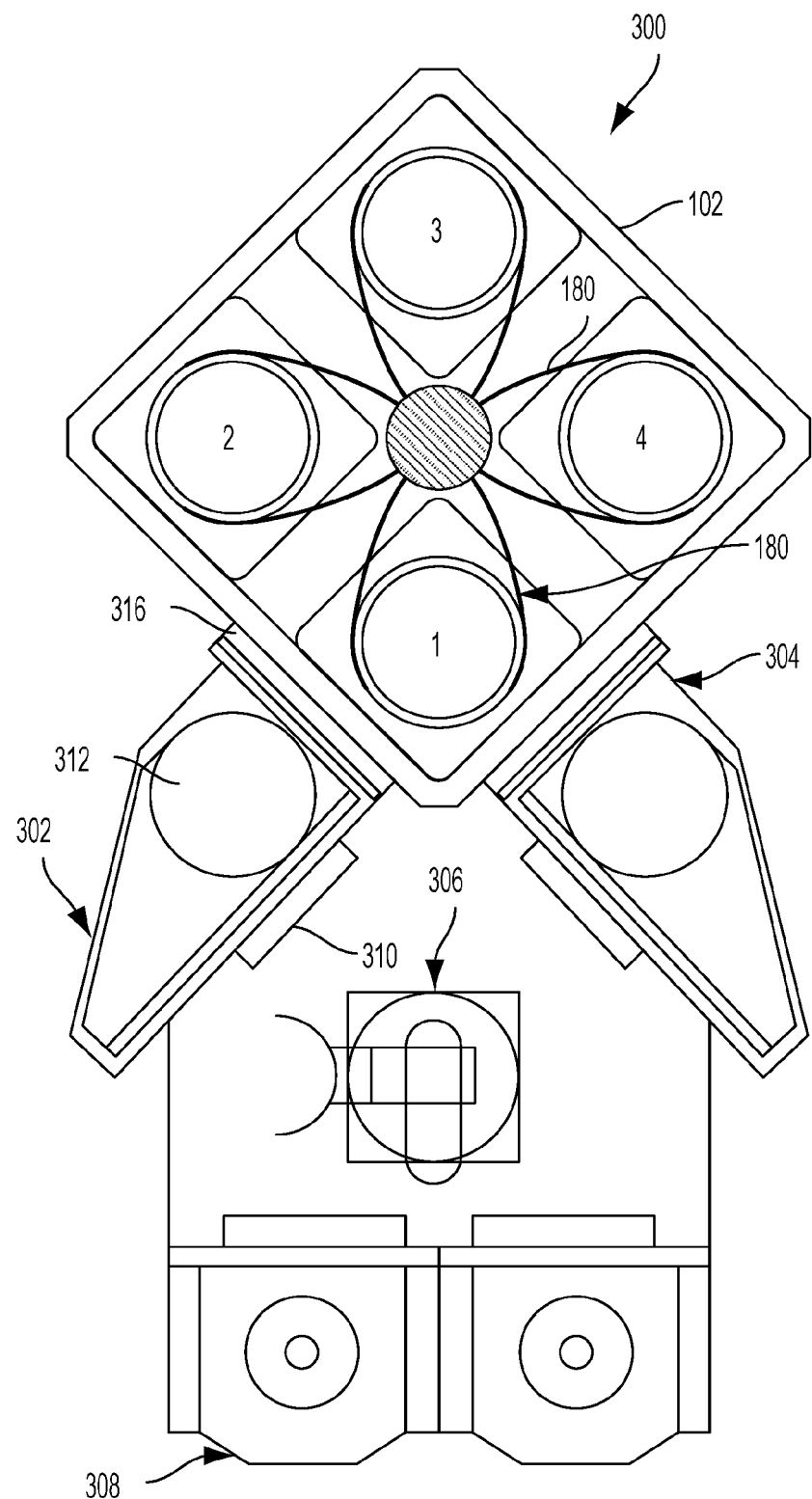
FIG. 3 shows a schematic view of an embodiment of the multi-station processing tool interfaced with an inbound load lock and an outbound load lock, in accordance with some embodiments of the present invention.

FIG. 3 shows a schematic view of an embodiment of the multi-station processing tool 300 interfaced with an inbound load lock 302 and an outbound load lock 304, in accordance with some embodiments of the present invention. A robot 306, at atmospheric pressure, is configured to move wafers 101 from a cassette loaded through a pod 308 into inbound load lock 302 via an atmospheric port 310. Inbound load lock 302 is coupled to a vacuum source/pump so that, when atmospheric port 310 is closed, inbound load lock 302 may be pumped down. Inbound load lock 302 also includes a chamber transport port 316 interfaced with processing chamber 102. Thus, when chamber transport 316 is opened, another robot 312 may move the wafer from inbound load lock 302 to the pedestal 140/140A of a first process station for processing.

The depicted processing chamber 102 comprises four process stations, numbered from 1 to 4 in the example embodiment shown in FIG. 3. In some embodiments, processing chamber 102 may be configured to maintain a low pressure environment so that wafers may be transferred using the carrier ring 200 among the process stations 1-4 without experiencing a vacuum break and/or air exposure. Each process station 1-4 depicted in FIG. 3 includes a pedestal 140/140A and showerhead electrode 150/150A and associated process gas supply connections. Also, it should be understood that in other embodiments the processing chamber 102 can include less than four process stations or more than four process stations.

FIG. 3 also shows the spider forks 180 for transferring wafers within the processing chamber 102. As mentioned above, the spider forks 180 rotate and enable transfer of wafers from one processing station to another. The transfer occurs by enabling the spider forks 180 to lift the carrier rings 200 from an outer undersurface, which lifts the wafers 101, and rotates the wafers 101 and carrier rings 200 together to the next processing station. In one configuration, the spider forks 180 are made from a ceramic material to withstand high levels of heat during processing.

Figure 4:
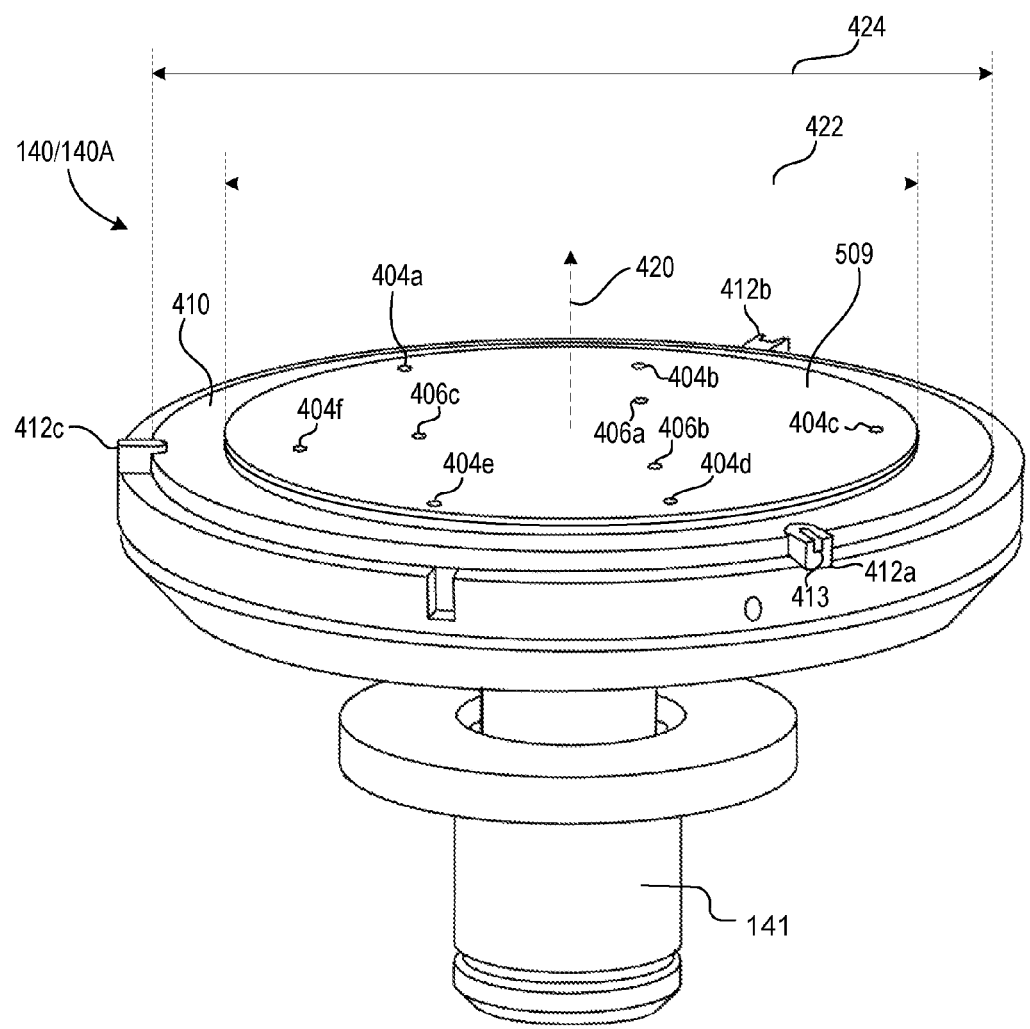
FIG. 4 shows an example of the pedestal configured to receive the wafer for a deposition process, such as an atomic layer deposition (ALD) process, in accordance with some embodiments of the present invention.

FIG. 4 shows an example of the pedestal 140/140A configured to receive the wafer 101 for a deposition process, such as an atomic layer deposition (ALD) process, in accordance with some embodiments of the present invention. In some embodiments, the pedestal 140/140A includes the electrically conductive layer 509 positioned on a central top surface of the pedestal 140/140A, where the central top surface is defined by a circular area extending from a central axis 420 of the pedestal 140/140A to a top surface diameter 422 that defines the edge of the central top surface. The electrically conductive layer 509 includes a plurality of wafer supports 404a, 404b, 404c, 404d, 404e, and 404f, which are distributed across the electrically conductive layer 509 and which are configured to support the wafer 101. A wafer support level is defined by the vertical position of the bottom surface of the wafer 101 when seated on the wafer supports 404a, 404b, 404c, 404d, 404e, and 404f. In the example of FIG. 4, there are six wafer supports 404a, 404b, 404c, 404d, 404e, and 404f symmetrically distributed about a periphery of the electrically conductive layer 509. However, in other embodiments there may be any number of wafer supports on the electrically conductive layer 509, and the wafer supports can be distributed across the electrically conductive layer 509 in any suitable arrangement for supporting the wafer 101 during deposition process operations.

In some embodiments, the electrically conductive layer 509 is not present on the central top surface of the pedestal 140/140A. And, in these embodiments, the wafer supports 404a, 404b, 404c, 404d, 404e, and 404f are disposed on the central top surface of the pedestal 140/140A. FIG. 4 also shows recesses 406a, 406b, and 406c, which are configured to house lift pins. The lift pins can be utilized to raise the wafer 101 from the wafer supports 404a, 404b, 404c, 404d, 404e, and 404f to allow for engagement of the wafer 101 by an end-effector.

In some embodiments, each wafer support 404a, 404b, 404c, 404d, 404e, and 404f defines a minimum contact area structure (MCA). MCA's are used to improve precision mating between surfaces when high precision or tolerances are required, and/or minimal physical contact is desirable to reduce defect risk. Other surfaces in the system can also include MCA's, such as over the carrier ring 200 supports and over the inner wafer support region of the carrier ring 200.

The pedestal 140/140A further includes an annular surface 410 extending from the top surface diameter 422 of the pedestal 140/140A to an outer diameter 424 of the annular surface 410. The annular surface 410 defines an annular region surrounding the electrically conductive layer 509, but at a step down from the electrically conductive layer 509. That is, the vertical position of the annular surface 410 is lower than the vertical position of the electrically conductive layer 509. A plurality of carrier ring supports 412a, 412b, and 412c are positioned substantially at/along the edge (outer diameter) of the annular surface 410 and are symmetrically distributed about the annular surface 410. The carrier ring supports can in some embodiments define MCA's for supporting the carrier ring 200. In some implementations, the carrier ring supports 412a, 412b, and 412c extend beyond the outer diameter 424 of the annular surface 410, whereas in other implementations they do not. In some implementations, the top surfaces of the carrier ring supports 412a, 412b, and 412c have a height that is slightly higher than that of the annular surface 410, so that when the carrier ring 200 is resting on the carrier ring supports 412a, 412b, and 412c, the carrier ring 200 is supported at a predefined distance above the annular surface 410. Each carrier ring support 412a, 412b, and 412c may include a recess, such as recess 413 of carrier ring support 412a, in which an extension protruding from the underside of the carrier ring 200 is seated when the carrier ring 200 is supported by the carrier ring supports 412a, 412b, and 412c. The mating of the carrier ring extensions to the recesses (413) in the carrier ring supports 412a, 412b, and 412c provides for secure positioning of the carrier ring 200 and prevents the carrier ring 200 from moving when seated on the carrier ring supports 412a, 412b, and 412c.

In some implementations, the top surfaces of the carrier ring supports 412a, 412b, and 412c are flush with the annular surface 410. In other implementations, there are no carrier ring supports separately defined from the annular surface 410, so that the carrier ring 200 may rest directly on the annular surface 410, and such that no gap exists between the carrier ring 200 and the annular surface 410. In such implementations, a pathway between the carrier ring 200 and the annular surface 410 is closed, preventing precursor materials from reaching a backside/underside of the wafer 101 via this pathway.

In the example embodiment of FIG. 4, there are three carrier ring supports 412a, 412b, and 412c positioned symmetrically along the outer edge region of the annular surface 410. However, in other implementations, there may be more than three carrier ring supports, distributed at any locations along the annular surface 410 of the pedestal 140/140A, to support the carrier ring 200 in a stable resting configuration.

When the wafer 101 is supported by the wafer supports 404a, 404b, 404c, 404d, 404e, and 404f, and when the carrier ring 200 is supported by the carrier ring supports 412a, 412b, and 412c, an edge region of the wafer 101 is disposed over an inner portion of the carrier ring 200. Generally speaking, the edge region of the wafer 101 extends from an outer edge of the wafer 101 inward by about 2 millimeters (mm) to about 5 mm. A vertical separation is thereby defined between the edge region of the wafer 101 and the inner portion of the carrier ring 200. In some embodiments, this vertical separation is about 0.001 inch to about 0.010 inch. The support of the carrier ring 200 at the predefined distance above the annular surface 410 and the vertical separation between the edge region of the wafer 101 and the inner portion of the carrier ring 200, can be controlled to limit deposition on a backside/underside of the wafer 101 in the edge region of the wafer 101.

Some plasmas used to deposit thin films or to treat the wafer surface are unstable under conditions that are preferred from a process standpoint. As an example, Ar/O2 capacitively-coupled-plasma (CCP) discharge operated within a 1 to 3 Torr pressure range and at high RF power (>200 W per 300 mm diameter wafer processing station) shows instabilities within the plasma. One such plasma instability, referred to herein as a "plasmoid," is characterized by small areas of higher density (brighter) plasma surrounded by larger volumes of normal density plasma. When plasmoids are formed, the deposited film is locally densified near the plasmoid due to interaction of the film with the local high density plasma corresponding to the plasmoid, which results in degraded film uniformity. A spatial distribution of plasmoids over the wafer 101 can vary from process-to-process, and within a given process. Also, the plasmoids can move across the wafer 101 during a given process. It should be understood that the plasmoids cause a degradation in process uniformity across the wafer 101, such as by changing density and thickness of a deposited film at different locations across the wafer 101. The non-uniformity in film thickness caused by the plasmoids can be about 1% to 2% of the total film thickness, which can be significant in some applications that require an ultra-flat film profile.

During an example film deposition process, an operation is performed to apply a monolayer of a precursor gas, without applying any RF power. The precursor gas sticks to the wafer 101. In some embodiments, the precursor gas includes silicon to enable formation of silicon oxide on the wafer. An operation is then performed to flush the precursor gas from the processing volume over the wafer 101, thereby leaving the monolayer of the precursor gas on the wafer 101. An oxidation process is then performed on the wafer 101. In the oxidation process, a process gas is flowed into the processing volume over the wafer 101 and RF power is applied to the process gas to generate a plasma within the processing volume. The plasma drives oxidation reactions on the wafer 101. In some embodiments, the process gas will contain oxygen plus one or more other bombardment gases, such as argon, among others, where the bombardment gas (es) provide sufficient densification of the plasma. In some embodiments, the bombardment gas is a gas that is effective in densifying a deposited film. Bombardment gases that densify the deposited film are those gases that can effectively transfer energy to the deposited film. In some embodiments, the bombardment gases are monoatomic noble gases, such as argon, among others, that do not react chemically with the deposited film and that lack vibrational or rotational molecular modes. For instance, in an example process, the process gas mixture can include about 5% to about 20% oxygen with the balance of the process gas mixture being argon. And, in other example processes, the percentage of oxygen to the bombardment gas in the process gas mixture can be less than 5% or greater than 20%.

During the oxidation process, when a particular thickness of film is formed on the wafer 101, the plasmoids may begin to appear across the wafer 101. The number and size of the plasmoids has a direct correlation with the amount of the bombardment process gas, e.g., argon, in the process gas mixture. So, reducing of the amount of bombardment process gas in the process gas mixture may serve to reduce the intensity of the plasmoids. However, the higher percentage of bombardment process gas is also typically necessary to provide sufficient plasma density to ensure proper film formation. Also, a large amount of RF power is needed to generate the plasma, because if there is not enough RF power applied, the plasma density will not be sufficient. However, increasing the applied RF power leads to formation of more plasmoids. Some process applications use about 300 W of applied RF power per 300 mm diameter wafer processing station. However, other process applications may require higher RF power, such as 400 W, or even higher, per 300 mm diameter wafer processing station.

In view of the foregoing, one approach for suppressing plasmoid formation is to reduce the applied RF power and/or increase the oxygen concentration within the gas mixture. More specifically, lower process power, i.e., lower applied RF power, or lower bombardment gas (typically argon) concentration within the process gas (with respect to oxygen) results in a lower plasma density, thus suppressing formation of plasmoids. Unfortunately, these conditions are not preferred from a deposited film quality perspective. For example, film quality is degraded when ion bombardment from the plasma is not sufficient at lower process power or lower bombardment gas concentration within the process gas. Therefore, it may not always be possible to maintain deposited film quality while suppressing plasmoid formation through lowering of the process power and/or lowering of the bombardment gas concentration, e.g., argon concentration, within the process gas.

Plasmoids may show up at the wafer 101 edge or close to the wafer 101 center. Plasmoids can also move over the wafer 101 and create patterns of high intensity glow when several individual plasmoids merge into larger ring-like structures. Due to the nature of the plasmoid, it is difficult to control exactly when and where plasmoid formation will occur over the wafer 101. Therefore, it is of interest to inhibit plasmoid formation without compromising on-wafer film thickness or other properties such as wet etch rate.

Energetic ions from the plasma may eject secondary electrons from the film material deposited on the wafer 101. These secondary electrons can be accelerated to high energy when pulled into the bulk plasma through the plasma sheath. These accelerated electrons may form regions of high-density, unstable plasma, such as the plasmoids. Such a behavior is commonly observed in argon-rich gas mixtures when discharge interacts with specific surfaces (e.g., film of specific composition and thickness). Therefore, it has been determined that plasmoid formation is dependent to some degree on ion bombardment energy and/or ion energy flux.

PEALD is a process that deposits a film on the wafer in successive monolayers. Each of these monolayers can be sensitive to ion bombardment conditions as they are being deposited with a net effect on the final deposited film properties, such as density and/or thickness. In this regard, PEALD processes have been observed to yield films with characteristics that depend on process variables known or believed to modulate ion energy. This ion energy dependence may be tied to either peak ion energy delivered or to the ion energy flux. Methods for providing precise and separated control of ion energy and ion energy flux in the PEALD process can be useful for gaining access to a process space that enables achievement of film qualities needed for fabrication of future advanced semiconductor device structures.

In addition to PEALD, there are other "continuous" deposition processes that yield films with properties sensitive to ion bombardment energy and/or ion energy flux. In particular, the final film stress of nitride films deposited by PECVD can be dependent on the RF power levels of the low frequency (LF) RF signals applied during processing. The RF power level of the LF RF signals is believed to modulate ion energy. Also, other applications, such as amorphous hard mask (AHM) applications, can exhibit film stress and film density dependence on ion energy.

Some PEALD processes, such as those involving oxides, use a single high frequency (HF) RF signal, such as 13.56 MHz in some embodiments, or 27.12 MHz in other embodiments. In these PEALD processes the normally available process variables, i.e., process parameters that can be adjusted to effect a change in the process results, include the HF RF power, the chamber pressure, the composition of the process gas(es), and the flow rate(s) of the process gas(es). The PEALD process has been conventionally constrained within a process space/window defined by these normally available process variables. However, as semiconductor device structures continue to shrink in size and increase in design complexity, the process space/window defined by these normally available PEALD process variables may not always be sufficient to yield satisfactory film deposition results.

In some PECVD processes, LF RF power (i.e., RF power at frequencies less than the system ion plasma frequency) is modulated to effect variation in deposited film properties that are believed to be dependent upon ion energy within the plasma. However, use of LF RF power can suppress plasma density, and/or distort the uniformity of the plasma process across the wafer, and/or increase the risk of electrical arcing within the chamber since the use of LF typically results in higher RF voltages at the electrodes. Also, in some cases, LF RF power can couple with HF RF power to produce undesirable deposited film results. Therefore, while use of LF RF power modulation may assist with control of ion energy dependent variations in deposited film properties, the use of LF RF power modulation has some side-effects that can be prohibitive.

Given the issues discussed above with regard to how ion bombardment energy and/or ion energy flux affect film deposition results on the wafer in processes such as PEALD and PECVD, either through direct ion interaction with the wafer or through formation of plasma instabilities such as plasmoids, systems and methods are disclosed herein for using the electrical asymmetry effect (EAE) to separately modulate ion energy flux and peak ion energy in order to control variations in film deposition results caused by plasma ion behavior. EAE is a technique in which multiple RF generators operate simultaneously at frequencies in a harmonic relationship, and in which the multiple RF generators are phase locked so as to operate at a specified phase angle relationship to each other. In one example embodiment, EAE is utilized in a plasma deposition process by operating two RF generators in a simultaneous manner at frequencies of 13.56 MHz and 27.12 MHz, respectively, and at a specific phase angle relationship to each other. It should be understood that in other embodiments more than two RF generators can be operated at respective frequencies having a harmonic relationship, and the respective frequencies can be different than 13.56 MHz and 27.12 MHz. Also, variation/control of the phase angle relationship between the multiple RF generators in the EAE-enabled plasma deposition process can be used to suppress plasma instability formation, such as plasmoid formation, and can provide for control of ALD-oxide film density, and can provide for control of film stress in PECVD deposition of nitrides. It should also be understood that use of EAE along with variation/control of its associated phase angle relationships can provide other plasma deposition process benefits, and serves to expand the effective process space/window of PECVD and PEALD plasma deposition processes.

Figure 5:
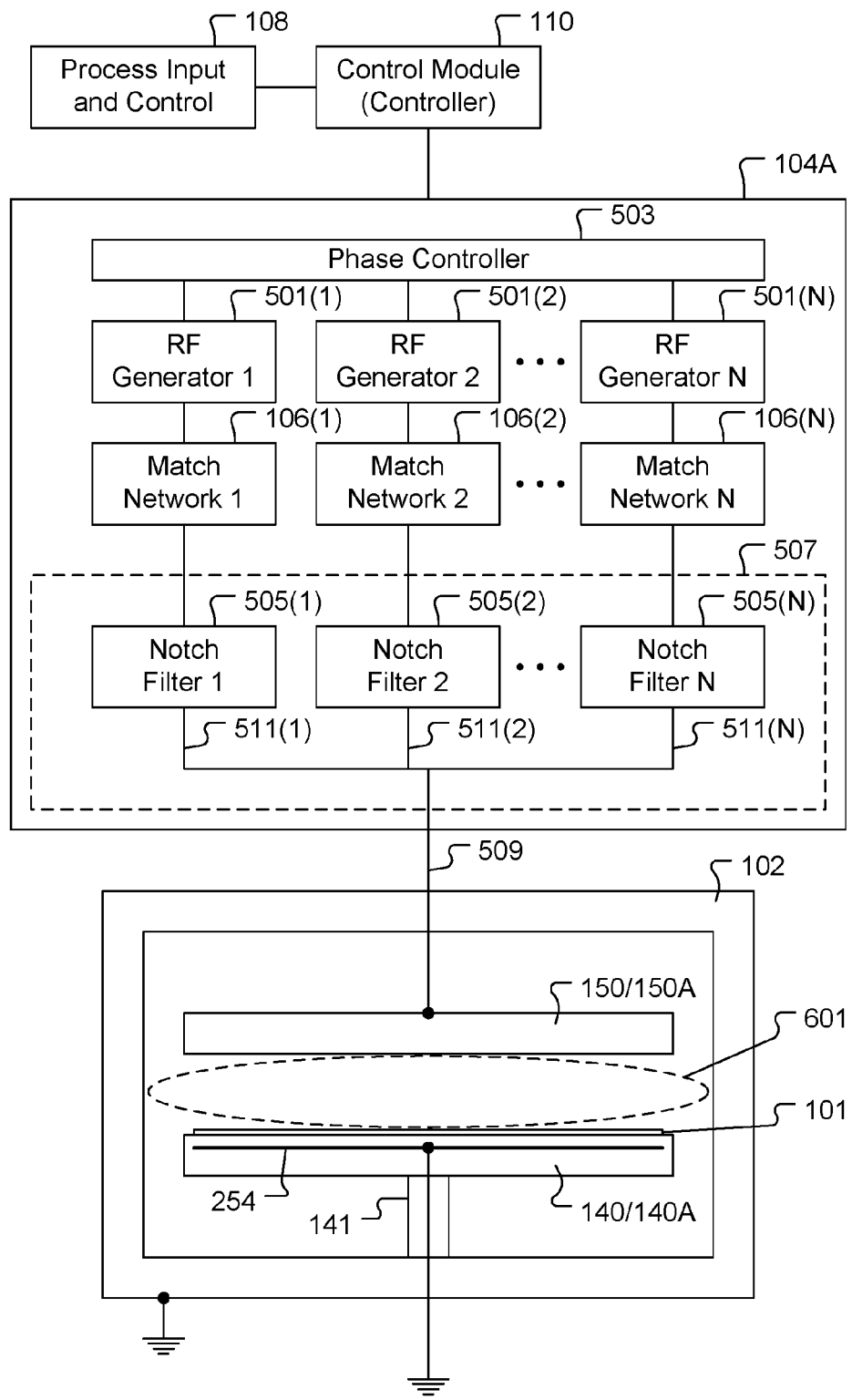
FIG. 5 shows a plasma processing system configured to implement electrical asymmetry effect (EAE) control to provide for separate modulation of ion energy flux and peak ion energy in order to control variations in film deposition results caused by plasma ion behavior, in accordance with some embodiments of the present invention.

FIG. 5 shows a plasma processing system configured to implement EAE control to provide for separate modulation of ion energy flux and peak ion energy in order to control variations in film deposition results caused by plasma ion behavior, in accordance with some embodiments of the present invention. The system of FIG. 5 includes the chamber 102 and corresponding components as described with regard to either FIG. 1A or FIG. 1B. In some embodiments, the system of FIG. 5 includes the showerhead electrode 150 and pedestal 140 as described with regard to FIG. 1A. And, in some embodiments, the system of FIG. 5 includes the showerhead electrode 150A and pedestal 140A as described with regard to FIG. 1B. The system of FIG. 5 includes an RF power supply 104A connected to supply RF power to the showerhead electrode 150/150A. The RF power supply 104A is also connected to receive control signals from the control module 110. In the system of FIG. 5, the RF electrode 254 within the pedestal 140A and/or the pedestal 140 is electrically connected to a reference ground potential.

The RF power supply 104A includes multiple, i.e., an integer number N greater than 1, RF generators 501(1)-501(N). Each RF generator 501(1)-501(N) is configured to output RF signals of a prescribed frequency. And, each RF generator 501(1)-501(N) is independently controllable, such that the prescribed RF signal frequency output by a given one of the RF generators 501(1)-501(N) can be different than the RF signal frequency output by others of the RF generators 501(1)-501(N). Each RF generator 501(1)-501(N) is connected to a phase controller 503. The phase controller 503 is configured to control a phase angle relationship between RF signals output by the RF generators 501(1)-501(N). More specifically, the phase controller 503 is configured to establish a prescribed phase angle relationship between RF signals output by any two of the RF generators 501(1)-501(N), and maintain that established prescribed phase angle relationship as long as needed during the plasma deposition process. Also, the phase controller 503 is configured to provide for controlled adjustment of any prescribed phase relationship between RF signals output by any two of the RF generators 501(1)-501(N) during the plasma deposition process. In this manner, the phase controller 503 and the multiple RF generators 501(1)-501(N) provide additional process variables to expand the process space/window of the plasma deposition process, including of a number (greater than 1) of RF signal frequencies applied, a value of each RF signal frequency applied, an amplitude of each RF signal applied, and a phase angle relationship between each RF signal applied.

Each RF generator 501(1)-501(N) is connected to output the RF signals that it generates to a corresponding one of multiple match networks 106(1)-106(N). Each of the multiple match networks 106(1)-106(N) is configured to control impedance matching so that the RF signals generated by the corresponding RF generator 501(1)-501(N) can be transmitted effectively to the plasma load within the chamber 102. Generally speaking, each of the multiple match networks 106(1)-106(N) includes matching circuitry configured as a network of capacitors and inductors that can be adjusted to tune impedance encountered by the RF signals in their transmission to the plasma load within the chamber 102.

Each of the multiple match networks 106(1)-106(N) has a respective output connected to a combiner module 507. In some embodiments, the combiner module 507 includes multiple notch filters 505(1)-505(N), with each notch filter 505(1)-505(N) connected to receive RF signals from a corresponding one of the match networks 106(1)-106(N). It should be understood that in some embodiments each notch filter 505(1)-505(N) can actually include multiple notch filters. Each of the notch filters 505(1)-505(N) is configured to reduce/eliminate signals outside of a narrow range of frequency. The notch filter 505(1)-505(N) corresponding to a given RF generator 501(1)-501(N) is configured to reduce/eliminate RF signals at frequencies of the other RF generators 501(1)-501(N). For example, the notch filter 505(1) corresponding to the RF generator 501(1) is configured to reduce/eliminate RF signals at frequencies output by the other RF generators 501(2)-501(N), and the notch filter 505(2) corresponding to the RF generator 501(2) is configured to reduce/eliminate RF signals at frequencies output by the other RF generators 501(1) and 501(3)-501(N), and so on. In this manner, the combiner 507 functions to combine cleaned versions of each RF signal as output from each match network 106(1)-106(N) associated with each RF generator 501(1)-501(N) onto a single output line 509 for transmission to the showerhead electrode 150/150A within the chamber 102. Also, in some embodiments, lengths of transmission lines 511(1)-511(N) extending from the outputs of the various notch filters 505(1)-505(N) to the single output line 509 can be individually varied to enable independent load impedance optimization for each RF signal frequency. Also, it should be understood that in some embodiments, the combiner module 507 can be configured to combine cleaned versions of each RF signal as output from each match network 106(1)-106(N) associated with each RF generator 501(1)-501(N) onto the single output line 509 using filter circuits other than the notch filters 505(1)-505(N). For example, in the case of two RF signal frequencies, an arrangement of one or more high pass filters and one or more low pass filters can be used to provide frequency-cleaned versions of the two RF signals to the single output line 509.

Figure 6:
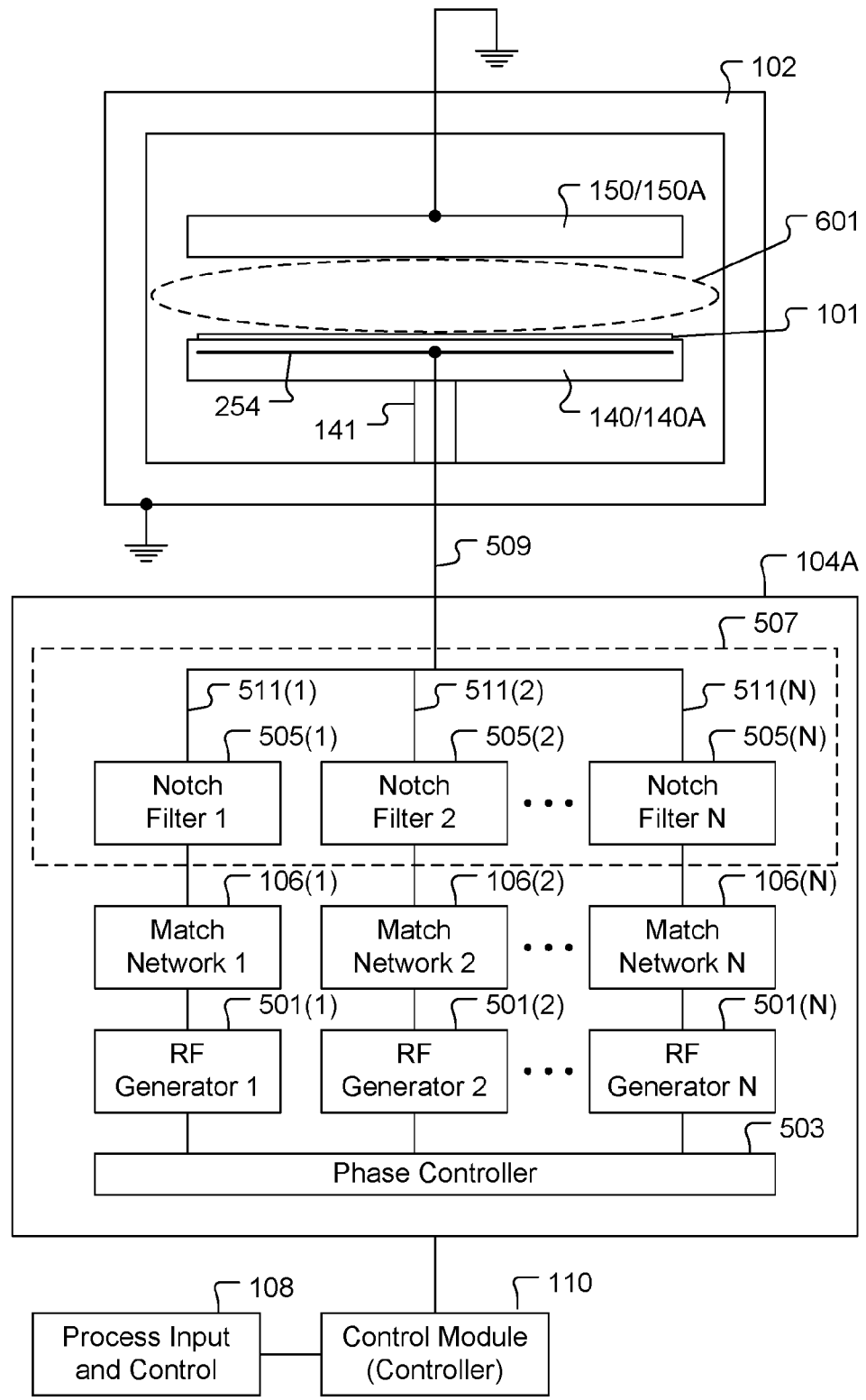
FIG. 6 shows another plasma processing system configured to implement EAE control to provide for separate modulation of ion energy flux and peak ion energy in order to control variations in film deposition results caused by plasma ion behavior, in accordance with some embodiments of the present invention.

FIG. 6 shows another plasma processing system configured to implement EAE control to provide for separate modulation of ion energy flux and peak ion energy in order to control variations in film deposition results caused by plasma ion behavior, in accordance with some embodiments of the present invention. In the system of FIG. 6, the RF power supply 104A is connected to supply RF signals to the RF electrode 254 within the pedestal 140/140A, and the showerhead electrode 150/150A is electrically connected to a reference ground potential. The RF power supply 104A shown in FIG. 6 is the same as that described with regard to FIG. 5.

Figure 7:
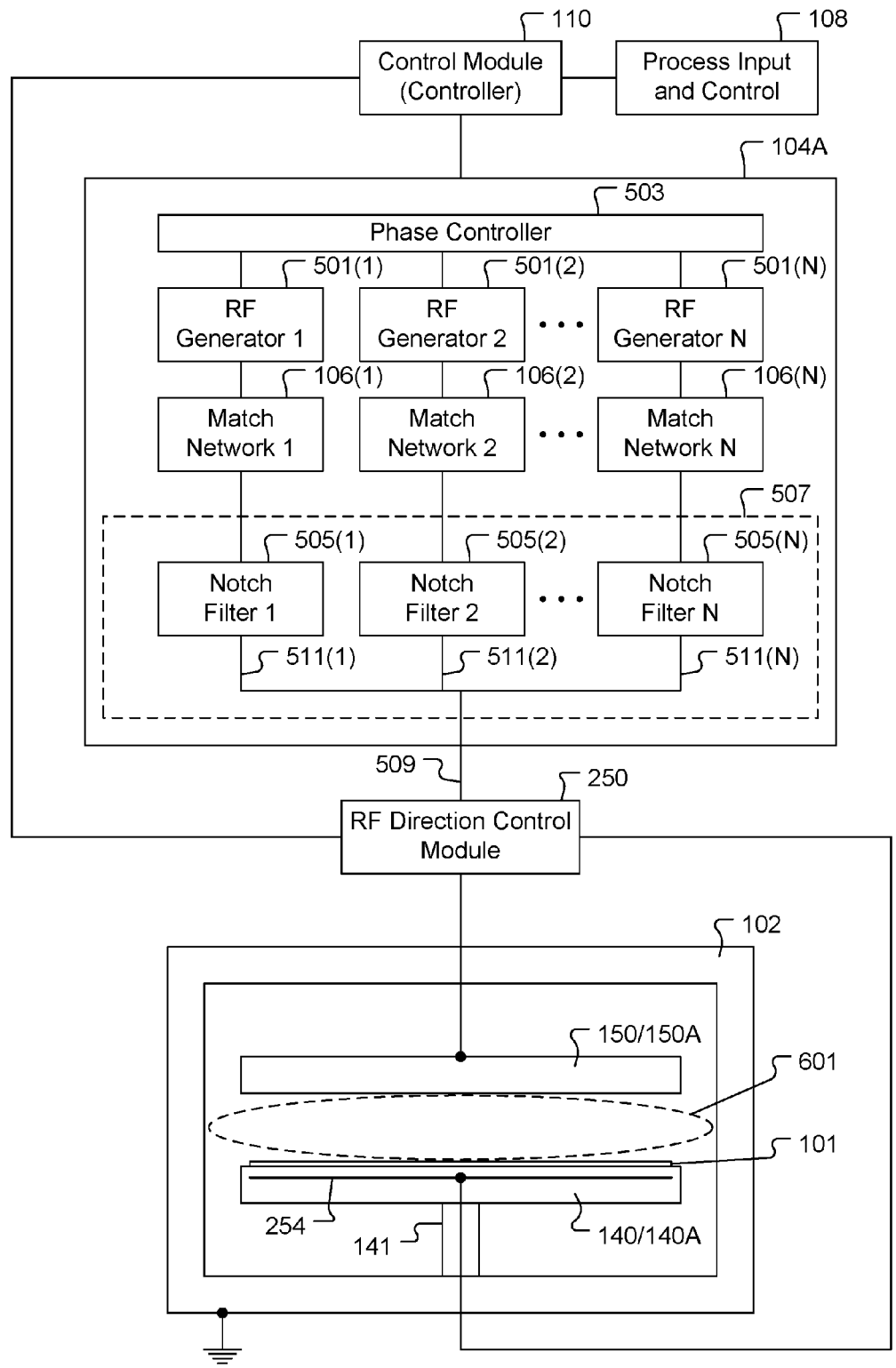
FIG. 7 shows another plasma processing system configured to implement EAE control to provide for separate modulation of ion energy flux and peak ion energy in order to control variations in film deposition results caused by plasma ion behavior, in accordance with some embodiments of the present invention.

FIG. 7 shows another plasma processing system configured to implement EAE control to provide for separate modulation of ion energy flux and peak ion energy in order to control variations in film deposition results caused by plasma ion behavior, in accordance with some embodiments of the present invention. The system of FIG. 7 implements the RF direction control module 250 as described with regard to FIGS. 1A and 1B. In some embodiments, the RF direction control module 250 is connected between the RF power supply 104A and both the RF electrode 254 within the pedestal/pedestal 140/140A and the showerhead electrode 150/150A to provide for operation of either the RF electrode 254 within the pedestal/pedestal 140/140A or the showerhead electrode 150/150A as the RF supply electrode at a given time, while the other of the RF electrode 254 within the pedestal/pedestal 140/140A and the showerhead electrode 150/150A is operated as the RF return electrode, i.e., reference ground electrode, at the given time.

The multiple (N>1) RF generators 501(1)-501(N) of the RF power supply 104A are set to operate at N frequencies, where a lowest of the N frequencies is a base frequency, i.e., fundamental frequency, and where each of the N frequencies that is greater than the base frequency is an even harmonic of the base frequency. And, the phase controller 503 operates to establish and control a phase angle relationship, i.e., RF voltage phase relationship, between the RF signals generated by the RF generators 501(1)-501(N). The phase angle relationship between the RF signals generated by the RF generators 501(1)-501(N) is deterministic and adjustable under the control of the phase controller 503. Variation of the phase angle relationship between the RF signals generated by the RF generators 501(1)-501(N) provides for variation of both direct current (DC) self bias and plasma potential, and in turn provides for variation in ion energy incident upon the wafer.

It should be understood that the RF power supply 104A can include any number N of RF generators 501(1)-501(N), where N is greater than 1. However, in some embodiments, the RF power supply 104A is configured to include two RF generators 501(1) and 501(2), i.e., N=2. And, these embodiments, the RF power supply 104A includes two match networks 106(1) and 106(2), and includes two notch filters 505(1) and 505(2), in addition to the phase controller 503, such as shown in FIGS. 5, 6, and 7. It should also be understood that each of the RF generators 501(1)-501(N) can be set to operate at essentially any frequency, so long as each of the different frequencies of the RF generators 501(1)-501(N) that is greater than the base frequency is an even harmonic of the base frequency. When an even integer harmonic relationship exists between a higher frequency and the base frequency, the higher frequency is an even integer multiple of the base frequency.

In some embodiments, a first RF generator 501(1) of the two RF generators in the above-mentioned embodiment is set to generate RF signals at a frequency of 13.56 MHz, and a second RF generator 501(2) of the two RF generators in the above-mentioned embodiment is set to generate RF signals at a frequency of 27.12 MHz, such that the even integer harmonic relationship of 2 exists between these two frequencies.

In the above-mentioned embodiment in which the two RF generators 501(1) and 501(2) are set to operate at frequencies of 13.56 MHz and 27.12 MHz, respectively, the power electrode voltage ($V_{electrode}(t)$) is given by Equation 1, where $A_{13.56}$ is the amplitude of the 13.56 MHz frequency RF signal, $f_{13.56}$ is the frequency of 13.56 MHz, $A_{27.12}$ is the amplitude of the 27.12 MHz frequency RF signal, $f_{27.12}$ is the frequency of 27.12 MHz, t is time, and $\phi$ is the EAE phase angle relationship between the 13.56 MHz and 27.12 MHz RF signals.

$$V_{electrode}(t) = A_{13.56} \sin(2\pi f_{13.56} t + \phi) + A_{27.12} \sin(4\pi f_{27.12} t) \quad \text{Equation 1.}$$

In using the above-mentioned embodiment in which the two RF generators 501(1) and 501(2) are set to operate at frequencies of 13.56 MHz and 27.12 MHz, respectively, to perform a PEALD-oxide film deposition process, the powered electrode voltage demonstrates good sinusoidal modulation with adjustment in the EAE phase angle relationship between the two RF signals. The modulation of powered electrode voltage indicates a minima near an EAE phase angle relationship of about 10° and a maxima near an EAE phase angle relationship of about 55°.

To explore the performance of this embodiment, a first wafer was subjected to the PEALD-oxide film deposition process using the EAE phase angle relationship of about 10°, and a second wafer was subjected to the PEALD-oxide film deposition process using the EAE phase angle relationship of about 55°. During the process using the EAE phase angle relationship of about 10°, no plasmoids were observed throughout the deposition process. However, during the process using the EAE phase angle relationship of about 55°, plasmoids appeared, i.e., turned on, at about cycle 50 and remained on for the duration of the process, which is similar to the plasmoid behavior observed using only RF signals of 13.56 MHz. In view of these results, it is demonstrated that plasmoids can be controlled, i.e., turned on and off, through modulation (controlled variation) of the EAE phase angle relationship.

Figure 8:
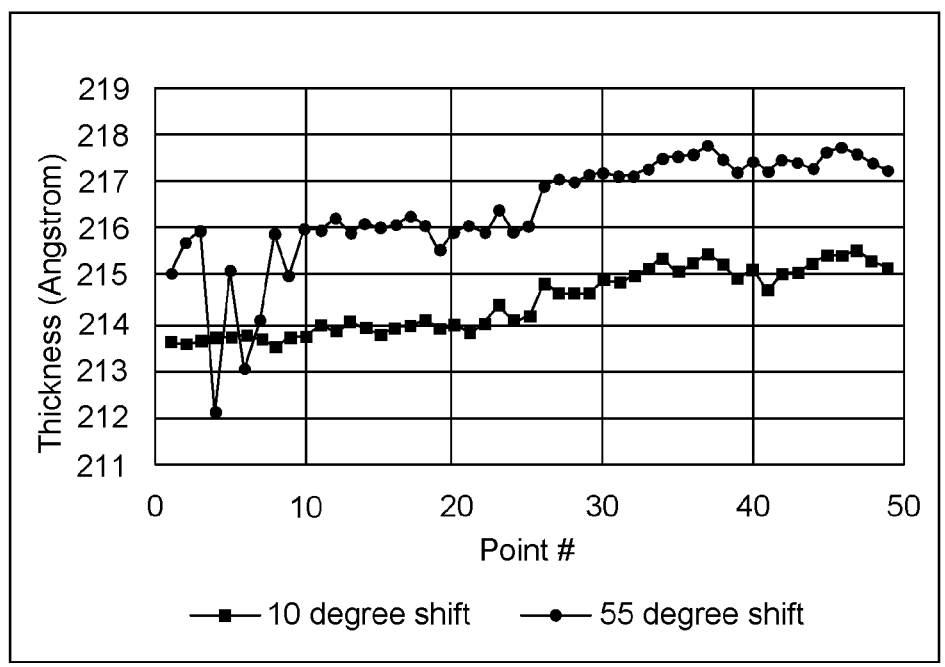
FIG. 8 shows plots of deposited film thickness profile across the wafer corresponding to use of the EAE phase angle relationship of about 10° and corresponding to use of the EAE phase angle relationship of about 55°, in accordance with some embodiments of the present invention.

FIG. 8 shows plots of deposited film thickness profile across the wafer corresponding to use of the EAE phase angle relationship of about 10° and corresponding to use of the EAE phase angle relationship of about 55°, in accordance with some embodiments of the present invention. As shown in FIG. 8, the process using the EAE phase angle relationship of about 10° had a lower film deposition rate than the process using the EAE phase angle relationship of about 55°. Also, FIG. 8 shows an aberration in deposited film thickness below location point 10 with use of the EAE phase angle relationship of about 55°, which is indicative of plasmoids present during the deposition process. In contrast, FIG. 8 shows no aberration in deposited film thickness across the profile with use of the EAE phase angle relationship of about 10°, which is indicative of no plasmoid formation during the deposition process.

Additionally, it was determined that the deposition process using the EAE phase angle relationship of about 10° provided a greater film density as compared to that obtained using the EAE phase angle relationship of about 55°, which is indicative of a lower wet etch rate (WER) with lower EAE phase angle relationship. Therefore, it has been demonstrated that by using of a lower EAE phase angle relationship it is possible to obtain a denser deposited film through generation of a higher density plasma in conjunction with a lower wafer bias and no plasmoid formation. Use of only a single RF frequency of 27.12 MHz did not provide for a denser deposited film through generation of a higher density plasma in conjunction with a lower wafer bias and no plasmoid formation. Also, based on deposition rate trends, use of only a single RF frequency of 27.12 MHz may provide a higher plasma density and a lower wafer bias as compared to use of only a single RF frequency of 13.56 MHz, but the film deposition rate using only the single RF frequency of 27.12 MHz is higher for a given power as compared to use of only the single RF frequency of 13.56 MHz.

With respect to PECVD, it was determined that the film stress of nitride films can be varied as the EAE phase angle relationship is varied. This dependence of film stress on the EAE phase angle relationship opens up an available process space/window for film deposition processes and provides for process and film characteristics that have been previously unattainable. More specifically, the methods and systems disclosed herein for simultaneously using multiple RF signal frequencies (where a lowest of the multiple RF signal frequencies is a base frequency, i.e., fundamental frequency, and where each radiofrequency signal having a frequency greater than the base frequency is in an even harmonic relationship with the radiofrequency signal of the base frequency, and where each radiofrequency signal having a frequency greater than the base frequency is in a fixed phase relationship with the radiofrequency signal of the base frequency) to generate the plasma for a film deposition process, in conjunction with controlled variation of the EAE phase angle relationship(s) between the multiple RF signal frequencies, expands the available process space/window available for both PEALD and PECVD processes by enabling separate control of ion energy and ion energy flux, and by providing for suppression of plasmoid formation.

In view of the foregoing, it should be understood that a system for performing a plasma process to deposit a film on a wafer is disclosed herein. The system includes a pedestal (140/140A) having a top surface configured to support a wafer (101). The system also includes a plasma generation region formed above the top surface of the pedestal (140/140A). The system also includes a process gas supply configured to supply a process gas composition to the plasma generation region. The process gas composition includes oxygen and at least one bombardment gas, where the at least one bombardment gas is effective in densifying the film deposited on the wafer. The system also includes an electrode (150/150A/254) disposed in proximity to the plasma generation region to provide for transmission of radiofrequency signals from the electrode (150/150A/254) into the plasma generation region. The system also includes a radiofrequency power supply (104A) configured to simultaneously supply multiple radiofrequency signals of different frequencies to the electrode (150/150A/254). A lowest of the different frequencies is a base frequency, i.e., fundamental frequency, and each radiofrequency signal having a frequency greater than the base frequency is in an even harmonic relationship with the radiofrequency signal of the base frequency, and where each radiofrequency signal having a frequency greater than the base frequency is in a fixed phase relationship with the radiofrequency signal of the base frequency. The multiple radiofrequency signals have respective frequencies set to transform the process gas composition into the plasma within the plasma generation region to cause deposition of the film on the wafer. The radiofrequency power supply (104A) also includes a phase controller configured to provide for variable control of a phase angle relationship between each of the multiple radiofrequency signals to control a parameters of the film deposited on the wafer. In various embodiments, the parameter of the film that is controlled by controlling the phase angle relationship between the multiple radiofrequency signals includes one or more of a density of the film, a stress of the film, a refractive index of the film, and a content of a minority material specie within the film, among other film parameters. Also, in some embodiments, the phase controller provides for adjustment of the phase angle relationship between the multiple radiofrequency signals to suppress plasmoid formation within the plasma.

The radiofrequency power supply (104A) includes multiple radiofrequency signal generators (501(1)-501(N)) for respectively generating each of the multiple radiofrequency signals. The radiofrequency power supply (104A) also includes a phase controller (503) connected to each of the multiple radiofrequency signal generators (501(1)-501(N)). The phase controller (503) is configured to provide for variable control of phase angle relationship between any pair of the multiple radiofrequency signals respectively generated by the multiple radiofrequency signal generators (501(1)-501(N)).

The radiofrequency power supply (104A) also includes multiple match networks (106(1)-106(N)) respectively connected to outputs of the multiple radiofrequency signal generators (501(1)-501(N)), such that each of the multiple radiofrequency signal generators (501(1)-501(N)) is connected to a separate one of the multiple match networks (106(1)-106(N)). The radiofrequency power supply also includes a combiner module (507) having inputs connected to outputs of the multiple match networks (106(1)-106(N)). The combiner module (507) is configured to combine clean versions of each of the multiple radiofrequency signals as output from the multiple match networks (106(1)-106(N)) corresponding to the multiple radiofrequency signal generators (501(1)-501(N)) onto a single output line (509) of the combiner module (507) for transmission to the electrode (150/150A/254).

In some embodiments, the combiner module (507) includes multiple notch filters (505(1)-505(N)), with each of the multiple notch filters (505(1)-505(N)) connected to receive radiofrequency signals from a corresponding one of the multiple match networks (106(1)-106(N)). Each of the multiple notch filters (505(1)-505(N)) is configured to reduce and/or eliminate signals outside of a narrow range of frequency. The outputs of the multiple notch filters (505(1)-505(N)) are connected to the single output line (509) of the combiner module (507).

Any given one of the multiple notch filters (505(1)-505(N)) is configured to pass signals corresponding to the frequency of the particular one of the multiple radiofrequency signal generators (501(1)-501(N)) to which the given one of the multiple notch filters (505(1)-505(N)) is connected by way of its corresponding one of the multiple match networks (106(1)-106(N)). And, the given one of the multiple notch filters (505(1)-505(N)) is configured to reduce and/or eliminate signals having frequencies corresponding to others of the multiple radiofrequency signal generators (501(1)-501(N)) different than the particular one of the multiple radiofrequency signal generators (501(1)-501(N)) to which the given one of the multiple notch filters (505(1)-505(N)) is connected by way of its corresponding one of the multiple match networks (106(1)-106(N)). In some embodiments, each of the multiple notch filters (505(1)-505(N)) includes multiple notch filters (505(1)-505(N)) within itself. Also, it should be understood that in some embodiments, the combiner module (507) can be configured to use filter circuits other than the notch filters (505(1)-505(N)). For example, in some embodiments, the combiner module (507) is configured to use an arrangement of one or more high pass filters and one or more low pass filters instead of notch filters or in combination with notch filters.

In some embodiments, the combiner module (507) includes separate transmission lines (511(1)-511(N)) disposed to respectively connect the outputs of the multiple notch filters (505(1)-505(N)) to the single output line (509) of the combiner module (507). And, each of the separate transmission lines (511(1)-511(N)) has an individually prescribed length to enable independent load impedance optimization for a particular radiofrequency signal frequency.

In some embodiments, the electrode (150/150A) is positioned over the plasma generation region, and the pedestal (140/140A) includes a ground electrode electrically connected to a reference ground potential, such as shown in FIG. 5. In some embodiments, the electrode (254) is positioned within the pedestal (140A) or the pedestal (140) itself serves as the electrode, and the system includes a ground electrode (150/150A) positioned over the plasma generation region, with the ground electrode (150/150A) electrically connected to a reference ground potential, such as shown in FIG. 6.

Figure 9:
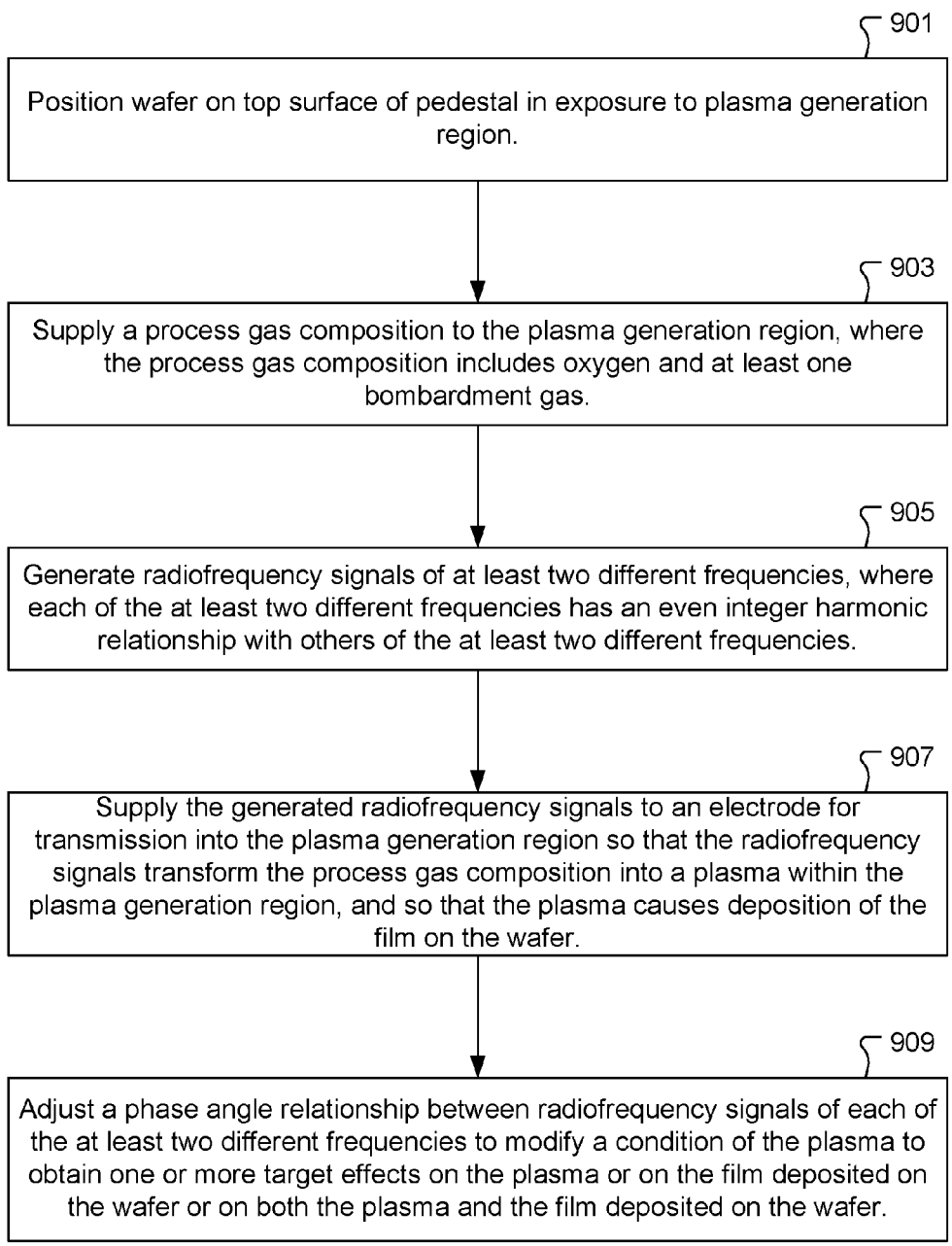
FIG. 9 shows a flowchart of a method for performing a plasma process to deposit a film on a wafer, in accordance with some embodiments of the present invention.

FIG. 9 shows a flowchart of a method for performing a plasma process to deposit a film on a wafer, in accordance with some embodiments of the present invention. In some embodiments, the plasma process is a PEALD process. In some embodiments, the plasma process is a PECVD process. The method includes an operation 901 for positioning a wafer on a top surface of a pedestal in exposure to a plasma generation region. The method also includes an operation 903 for supplying a process gas composition to the plasma generation region. The process gas composition includes oxygen and at least one bombardment gas. In some embodiments, the at least one bombardment gas is effective in densifying the film deposited on the wafer. In some embodiments, the at least one bombardment gas includes a monoatomic noble gas. In some embodiments, the at least one bombardment gas lacks vibrational or rotational molecular modes. In some embodiments, the at least one bombardment gas is argon.

The method also includes an operation 905 for generating radiofrequency signals of at least two different frequencies. A lowest of the at least two different frequencies is a base frequency, i.e., fundamental frequency, and each radiofrequency signal having a frequency greater than the base frequency is in an even harmonic relationship with the radiofrequency signal of the base frequency, and where each radiofrequency signal having a frequency greater than the base frequency is in a fixed phase relationship with the radiofrequency signal of the base frequency. The method also includes an operation 907 for supplying the generated radiofrequency signals to an electrode for transmission into the plasma generation region. The radiofrequency signals transform the process gas composition into a plasma within the plasma generation region, and the plasma causes deposition of the film on the wafer. The method also includes an operation 909 for adjusting a phase angle relationship between radiofrequency signals of each of the at least two different frequencies to control a parameter of the film deposited on the wafer. In some embodiments, the parameter of the film that is controlled by adjusting the phase angle relationship between radiofrequency signals in operation 909 includes one or more of a density of the film, a stress of the film, a refractive index of the film, and a content of a minority material specie within the film, among other film parameters. For example, with regard to controlling the content of a minority material specie within the film, in some embodiments the minority material specie may be hydrogen, with ion bombardment on the film removing hydrogen from the film. And, in these embodiments, the phase angle relationship between radiofrequency signals of each of the at least two different frequencies can be adjusted to control ion bombardment on the film, which in turn controls the hydrogen content within the film. It should be understood that control of hydrogen content within the film is one of many examples of how the phase angle adjustment of operation 909 can be used to control the content of a minority material specie within the film. Also, in some embodiments, adjusting the phase angle relationship between radiofrequency signals of each of the at least two different frequencies in operation 909 is performed to suppress plasmoid formation within the plasma. And, such suppression of plasmoid formation can be achieved in conjunction with control of a given parameter of the deposited film.

The method can also include providing a separate impedance matching for each of the generated radiofrequency signals. And, the method can include combining the radiofrequency signals of at least two different frequencies onto a single output line for transmission to the electrode. In some embodiments, combining the radiofrequency signals includes processing each of the radiofrequency signals to filter out signals of frequency different than that of the processed radiofrequency signal prior to transmission of the processed radiofrequency signal to the single output line.

In some embodiments, generating radiofrequency signals of at least two different frequencies in operation 903 includes generating a first radiofrequency signal having a frequency of about 13.56 MHz and generating a second radiofrequency signal having a frequency of about 27.12 MHz. And, in these embodiments controlling the phase angle relationship between radiofrequency signals of each of the at least two different frequencies in operation 905 includes controlling a phase angle relationship between the first radiofrequency signal and the second radiofrequency signal to be about 10 degrees. It should be understood, however, that in other embodiments the method of FIG. 9 can include generating radiofrequency signals of frequencies other than 13.56 MHz and 27.12 MHz, and can include controlling the phase angle relationship at other than 10 degrees.

The systems and methods disclosed herein for controlling EAE phase angle relationship between radiofrequency signals of different frequency are effective in controlling film densification and in suppressing plasmoid formation during various plasma-enhanced deposition processes, such as PEALD and PECVD processes. However, it should also be understood that the systems and methods disclosed herein for controlling EAE phase angle relationship between radiofrequency signals of different frequency provides for separation of ion energy control from plasma density control in many different plasma-enhanced film deposition processes. The systems and methods disclosed herein provide for control of essentially any process film parameter that is dependent on ion energy by use of a phase angle adjustment rather than by a change in the total power applied to the plasma. This control of process film parameter(s) by phase angle adjustment rather than by total power adjustment can be utilized in essentially any plasma-based film deposition process. For example, fabrication of some semiconductor devices, such as VNAND devices, require deposition of a large number of successive films (perhaps 50 or more) of alternating materials, such as oxide and nitride, where each film layer needs to be stress tuned so that the overall film stack satisfies a given film stress specification. In such embodiments, the systems and methods disclosed herein for using phase angle adjustment to control ion energy separate from plasma density can be used to control the stress of each deposited film layer based on the specific characteristics of that deposited film layer. It should be understood that the systems and methods disclosed herein for using phase angle adjustment to control ion energy separate from plasma density can be used to control essentially any parameter of a deposited film that is dependent on ion energy.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for performing a plasma process to deposit a film on a wafer, comprising:
    positioning the wafer on a top surface of a pedestal in exposure to a plasma generation region;
    supplying a process gas composition to the plasma generation region, the process gas composition including oxygen and at least one bombardment gas;
    generating radiofrequency signals of at least two different frequencies, wherein a lowest of the at least two different frequencies is a base frequency, and wherein each radiofrequency signal having a frequency greater than the base frequency is in an even harmonic relationship with the radiofrequency signal of the base frequency, and wherein each radiofrequency signal having a frequency greater than the base frequency is in a fixed phase relationship with the radiofrequency signal of the base frequency;
    supplying the generated radiofrequency signals to an electrode for transmission into the plasma generation region, the radiofrequency signals transforming the process gas composition into a plasma within the plasma generation region, the plasma causing deposition of the film on the wafer; and
    adjusting a phase angle relationship between radiofrequency signals of each of the at least two different frequencies to control a parameter of the film deposited on the wafer.

2. The method as recited in claim 1, further comprising: providing a separate impedance matching for each of the generated radiofrequency signals.

3. The method as recited in claim 2, further comprising:
    combining the radiofrequency signals of at least two different frequencies onto a single output line for transmission to the electrode.

4. The method as recited in claim 3, wherein combining the radiofrequency signals includes processing each of the radiofrequency signals to filter out signals of frequency different than that of the processed radiofrequency signal prior to transmission of the processed radiofrequency signal to the single output line.

5. The method as recited in claim 4, wherein generating radiofrequency signals of at least two different frequencies includes generating a first radiofrequency signal having a frequency of about 13.56 MHz and generating a second radiofrequency signal having a frequency of about 27.12 MHz, and wherein controlling the phase angle relationship between radiofrequency signals of each of the at least two different frequencies includes controlling a phase angle relationship between the first radiofrequency signal and the second radiofrequency signal.

6. The method as recited in claim 1, wherein the at least one bombardment gas includes a monoatomic noble gas.

7. The method as recited in claim 6, wherein the at least one bombardment gas lacks vibrational or rotational molecular modes.

8. The method as recited in claim 1, wherein the at least one bombardment gas is argon.

9. The method as recited in claim 1, wherein the plasma process is a plasma enabled atomic layer deposition process.

10. The method as recited in claim 1, wherein the plasma process is a plasma enabled chemical vapor deposition process.

11. The method as recited in claim 1, wherein the parameter of the film that is controlled by adjusting the phase angle relationship between radiofrequency signals of each of the at least two different frequencies includes one or more of a density of the film, a stress of the film, a refractive index of the film, and a content of a minority material specie within the film.

12. The method as recited in claim 1, wherein adjusting the phase angle relationship between radiofrequency signals of each of the at least two different frequencies is performed to suppress plasmoid formation within the plasma.

13. The method as recited in claim 1, wherein the at least one bombardment gas is effective in densifying the film deposited on the wafer.

14. A system for performing a plasma process to deposit a film on a wafer, comprising:
    a pedestal having a top surface configured to support the wafer;
    a plasma generation region formed above the top surface of the pedestal;
    a process gas supply configured to supply a process gas composition to the plasma generation region, the process gas composition including oxygen and at least one bombardment gas;
    an electrode disposed in proximity to the plasma generation region to provide for transmission of radiofrequency signals from the electrode into the plasma generation region; and
    a radiofrequency power supply configured to simultaneously supply multiple radiofrequency signals of different frequencies to the electrode, wherein a lowest of the different frequencies is a base frequency, and wherein each radiofrequency signal having a frequency greater than the base frequency is in an even harmonic relationship with the radiofrequency signal of the base frequency, and wherein each radiofrequency signal having a frequency greater than the base frequency is in a fixed phase relationship with the radiofrequency signal of the base frequency, the multiple radiofrequency signals having respective frequencies set to transform the process gas composition into the plasma within the plasma generation region to cause deposition of the film on the wafer, the radiofrequency power supply also including a phase controller configured to provide for variable control of a phase angle relationship between each of the multiple radiofrequency signals, wherein adjustment of the phase angle relationship is used to control a parameter of the film deposited on the wafer.

15. The system as recited in claim 14, wherein the radiofrequency power supply includes multiple radiofrequency signal generators for respectively generating each of the multiple radiofrequency signals.

16. The system as recited in claim 15, wherein the phase controller is connected to each of the multiple radiofrequency signal generators, the phase controller configured to provide for variable control of phase angle relationship between any pair of the multiple radiofrequency signals respectively generated by the multiple radiofrequency signal generators.

17. The system as recited in claim 15, wherein the radiofrequency power supply includes multiple match networks respectively connected to outputs of the multiple radiofrequency signal generators, such that each of the multiple radiofrequency signal generators is connected to a separate one of the multiple match networks.

18. The system as recited in claim 17, wherein the radiofrequency power supply includes a combiner module having inputs connected to outputs of the multiple match networks, the combiner module configured to combine clean versions of each of the multiple radiofrequency signals as output from the multiple match networks corresponding to the multiple radiofrequency signal generators onto a single output line of the combiner module for transmission to the electrode.

19. The system as recited in claim 18, wherein the combiner module includes multiple notch filters, with each of the multiple notch filters connected to receive radiofrequency signals from a corresponding one of the multiple match networks, wherein each of the multiple notch filters is configured to reduce and/or eliminate signals outside of a narrow range of frequency, and wherein outputs of the multiple notch filters are connected to the single output line of the combiner module.

20. The system as recited in claim 19, wherein any given one of the multiple notch filters is configured to pass signals corresponding to the frequency of the particular one of the multiple radiofrequency signal generators to which the given one of the multiple notch filters is connected by way of its corresponding one of the multiple match networks, and wherein the given one of the multiple notch filters is configured to reduce and/or eliminate signals having frequencies corresponding to others of the multiple radiofrequency signal generators different than the particular one of the multiple radiofrequency signal generators to which the given one of the multiple notch filters is connected by way of its corresponding one of the multiple match networks.

21. The system as recited in claim 20, wherein each of the multiple notch filters includes multiple notch filters.

22. The system as recited in claim 19, wherein the combiner module includes separate transmission lines disposed to respectively connect the outputs of the multiple notch filters to the single output line of the combiner module, and wherein each of the separate transmission lines has an individually prescribed length to enable independent load impedance optimization for a particular radiofrequency signal frequency.

23. The system as recited in claim 14, wherein the electrode is positioned over the plasma generation region, and wherein the pedestal includes a ground electrode electrically connected to a reference ground potential.

24. The system as recited in claim 14, wherein the electrode is positioned within the pedestal, and wherein the system includes a ground electrode positioned over the plasma generation region, the ground electrode electrically connected to a reference ground potential.

* * * * *